(12) United States Patent
Sah

(10) Patent No.: US 8,026,598 B2
(45) Date of Patent: Sep. 27, 2011

(54) SEMICONDUCTOR CHIP MODULE WITH STACKED FLIP-CHIP UNIT

(75) Inventor: Wen-Jyh Sah, Tainan (TW)

(73) Assignee: Gigno Technology Co., Ltd., Taipei (TW)

( * ) Notice: Subject to any disclaimer, the term of this patent is extended or adjusted under 35 U.S.C. 154(b) by 0 days.

(21) Appl. No.: 12/496,244

(22) Filed: Jul. 1, 2009

(65) Prior Publication Data

US 2010/0001398 A1    Jan. 7, 2010

(30) Foreign Application Priority Data

Jul. 4, 2008   (TW) .............................. 97125447 A

(51) Int. Cl.
*H01L 25/065* (2006.01)
*H01L 23/538* (2006.01)

(52) U.S. Cl. ........... 257/723; 257/E25.01; 257/E23.169; 257/778; 257/686; 257/685; 257/777; 257/734; 257/737; 257/738

(58) Field of Classification Search ............... 257/723, 257/778, E23.168, E25.01, 686, 685, 777, 257/734, 737, 738
See application file for complete search history.

(56) References Cited

U.S. PATENT DOCUMENTS

| 4,328,530 | A  | * | 5/1982 | Bajorek et al. ............... 361/762 |
| 5,432,729 | A  | * | 7/1995 | Carson et al. .................. 365/63 |
| 7,389,012 | B2 | * | 6/2008 | Oggioni et al. ................ 385/14 |
| 2003/0068920 | A1 | * | 4/2003 | Li et al. ....................... 439/502 |
| 2006/0214153 | A1 | * | 9/2006 | Ikezawa et al. ................ 257/40 |
| 2008/0069494 | A1 | * | 3/2008 | Oggioni et al. ................ 385/14 |
| 2008/0157331 | A1 | * | 7/2008 | Onodera ....................... 257/686 |
| 2008/0188030 | A1 | * | 8/2008 | Kang ............................ 438/65 |
| 2008/0224325 | A1 | * | 9/2008 | Nishimura et al. ........... 257/778 |
| 2009/0212407 | A1 | * | 8/2009 | Foster et al. .................. 257/686 |

\* cited by examiner

*Primary Examiner* — A Williams
(74) *Attorney, Agent, or Firm* — Birch, Stewart, Kolasch & Birch, LLP

(57) ABSTRACT

A semiconductor chip module includes a first flip-chip unit and a second flip-chip unit. The first flip-chip unit has a first chip and a first glass circuit board. The first chip is connected with the first glass circuit board by flip-chip bonding. The second flip-chip unit has a second chip and a second glass circuit board. The second chip is connected with the second glass circuit board by flip-chip bonding. The first flip-chip unit and the second flip-chip unit are attached to each other. A method for manufacturing the semiconductor chip module is also disclosed.

7 Claims, 11 Drawing Sheets

SEMICONDUCTOR CHIP MODULE WITH STACKED FLIP-CHIP UNIT

CROSS REFERENCE TO RELATED APPLICATIONS

This Non-provisional application claims priority under 35 U.S.C. §119(a) on Patent Application No(s). 097125447 filed in Taiwan, Republic of China on Jul. 4, 2008, the entire contents of which are hereby incorporated by reference.

BACKGROUND OF THE INVENTION

1. Field of Invention

The present invention relates to a chip module and its manufacturing method and, in particular, to a semiconductor chip module and a manufacturing method thereof.

2. Related Art

As the electronic products tend to be smaller and have high efficiency, the capacity and the performance of the semiconductor circuit are enhanced to meet the users' needs during development. Thus, a multi-chip module becomes one of the focus researches in recent years. It is a semiconductor chip module package formed with a plurality of chips by stacking, such that the chips with different functions may be integrated into one semiconductor chip module package.

FIG. 1 is a schematic view of a conventional semiconductor module package 1 having a plurality of stacked chips. With reference to FIG. 1, the semiconductor chip module package 1 includes a substrate 11, a chip 12, a spacer 13, a chip 14, a molding gel 15, and a plurality of wires W. The chip 12 is disposed on the substrate 11 and electrically connected to the substrate 11 by wire bonding. The spacer 13 is a substrate and disposed between two chips 12 and 14. It can electrically isolate the two chips 12 and 14 and maintains the wire-bonding area on the chip 12. Furthermore, the molding gel 15 covers the wires W for protection.

The chips 12 and 14 are electrically connected and stacked to each other by wire bonding. However, the size of the bonding head is large and the disposition of the wires W needs a certain height and distance, such that the spacer 13 is needed to increase the height and the distance between the chips 12 and 14 so to facilitate the movement of the bonding head and the disposition of the wires W. Nonetheless, it also reduces the integration of the semiconductor chip module package 1. Besides, the chips 12 and 14 will take the bonding force as the bonding head implements wire bonding, thus the thicknesses of the chips 12 and 14 have to be large enough to prevent damage (e.g. the chip thickness cannot be smaller than 50 µm), such that the size of the stacked semiconductor chip module package 1 may not be further reduced.

In addition, since the chips 12 and 14 are electrically connected by wire bonding, they may be electrically connected to the substrate 11 after stacking. That is, they cannot be separately wire-bonded on the substrate 11 and then stacked. This reduces the adaptability of the manufacturing process and extends the manufacturing time. Additionally, the yield and the reliability of the product may be reduced since the wires in the wire-bonded products may be easily broken, which results in the malfunctions of the products.

Therefore, it is an important subject to provide a semiconductor chip module that is manufactured by a different stacking method for further reducing its size, increasing the adaptability of the manufacturing process, and enhancing the yield and reliability of the product.

SUMMARY OF THE INVENTION

In view of the foregoing, the present invention is to provide a semiconductor and a manufacturing method thereof that can reduce the product size, enhance the adaptability of the product manufacturing process, and increase the yield and reliability of the product.

To achieve the above, the present invention discloses a semiconductor chip module that includes a first flip-chip unit and a second flip-chip unit. The first flip-chip unit has a first chip and a first glass circuit board. The first chip is connected to the first glass circuit board by flip-chip bonding. The second flip-chip unit has a second chip and a second glass circuit board. The second chip is connected to the second glass circuit board by flip-chip bonding. The first flip-chip unit and the second flip-chip unit are attached to each other.

The total thickness of the first flip-chip unit in the semiconductor chip module of the present invention is smaller than 100 µm.

The semiconductor chip module of the present invention further includes a module circuit board. The first flip-chip unit and the second flip-chip unit are electrically connected to the module circuit board, and the first glass circuit board and the second glass circuit board are substantially perpendicular to the module circuit board.

To achieve the above, a method for manufacturing a semiconductor chip module of the present invention includes the steps of: electrically connecting a first chip to a first glass circuit board by flip-chip bonding; electrically connecting a second chip to a second glass circuit board by flip-chip bonding; attaching the first flip-chip unit and the second flip-chip unit; and reducing the thickness of the first chip, the second chip, the first glass circuit board, or the second glass circuit board.

As mentioned above, in the semiconductor chip module and its manufacturing method of the present invention, a plurality of flip-chip units are attached to each other, and the chips of the flip-chip unit are electrically connected to the glass circuit boards by flip-chip bonding. The chips of the present invention are not electrically connected and stacked to each other by wire bonding; therefore an additional spacer is not needed between the chips, so as to reduce the size of the stacked chips. Each flip-chip unit may be manufactured, respectively, and then stacked to each other, such that the adaptability of the manufacturing process can be enhanced.

In addition, the structure strength of the flip-chip unit of the present invention is larger than the structure strength formed by wire bonding. This can increase the yield and the reliability of the product. Furthermore, the glass circuit board and chip of the flip-chip unit may be further processed for they are not connected by wire bonding. For example, the flip-chip unit may be thinned to make the thickness of the flip-chip unit to be less than 100 µm, so as to greatly decrease the size of the stacked chips and increase their integration. Besides, the flip-chip unit of the present invention is substantially perpendicular to the module circuit board. Compared to the conventional horizontal disposition on the module circuit board, the size of the stacked chips may be further reduced and the integration thereof may be increased in the present invention.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
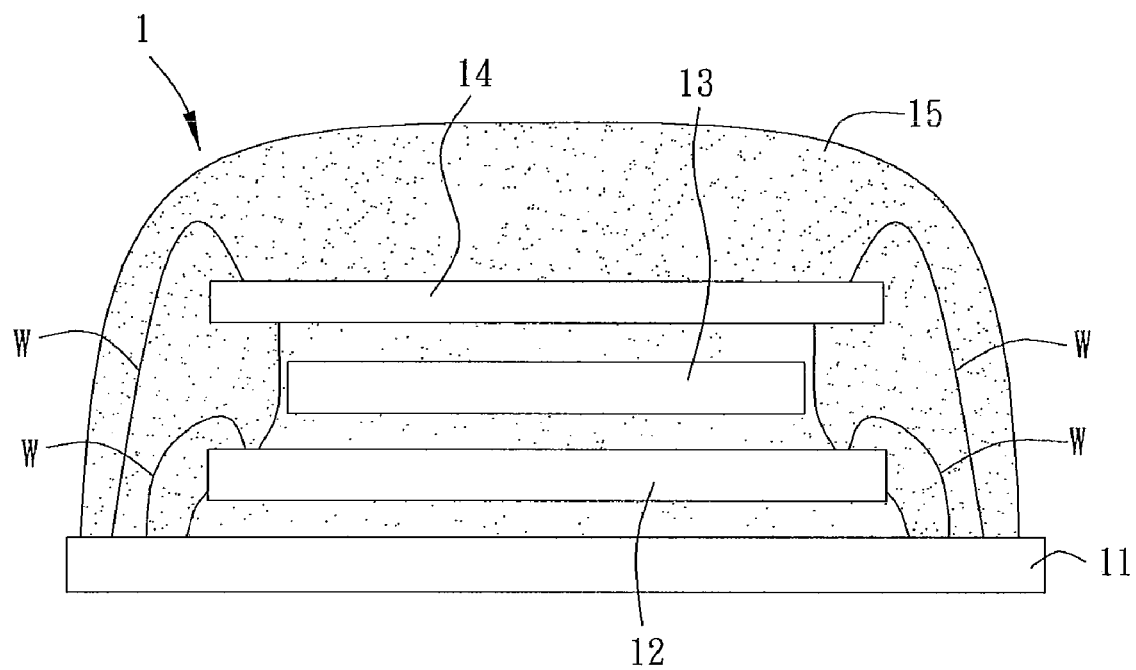
FIG. 1 is a schematic view of a conventional wire-bonded semiconductor chip module.
Figure 2A:
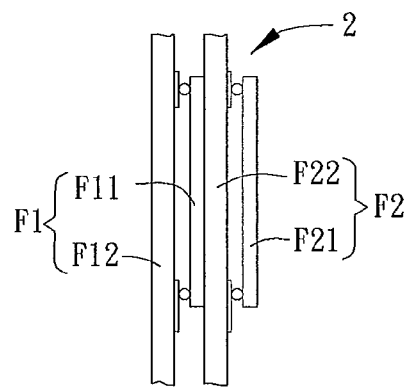
FIGS. 2A to 2D are schematic views of different attaching aspects of a flip-chip unit in a semiconductor chip module according to a preferred embodiment of the present invention.

FIG. 2A is a schematic view of a semiconductor chip module 2 according to a preferred embodiment of the present invention. The semiconductor chip module 2 includes a first flip-chip unit F1 and a second flip-chip unit F2.

The first flip-chip unit F1 includes a first chip F11 and a first glass circuit board F12. The first chip is connected to the first glass circuit board F12 by flip-chip bonding. The second flip-chip unit F2 has a second chip F21 and a second glass circuit board F22. The second chip F21 is connected to the second glass circuit board F22 by flip-chip bonding. The first flip-chip unit F1 and the second flip-chip unit F2 are attached to each other by, for example, an adhesive.

In the embodiment, the first chip F11 and/or the second chip F21 may be a die, and it can be a memory chip, a processor chip, a graphics processing chip, a video processing chip, an ASIC, or a communication processing chip. Additionally, the number of the first chips F11 and the second chips F21 may be one or more and are not limited in the embodiment. A plurality of first chips F11 or second chips F21 may be a multi-core CPU.

The first glass circuit board F12 and the second glass circuit board F22 are circuit layers formed on the glass plate. The coefficient of thermal expansion of the glass material is close to those of the chips F11 and F21, thus the thermal stress caused by the manufacturing process or the environment are not taken into account. Moreover, the glass plate has a high smooth level (close to the level of a wafer), which is better than that of a ceramic substrate, a metal substrate, or a resin substrate, such that the precision of the circuit pattern formed during the photolithography process is high and the line space between the pads or the wires on the circuit layer may be as small as 15 μm. Additionally, the heat conduction of the glass is better than that of the ceramics or resin, and this helps the heat dissipation of the chips F11 and F21. Besides, glass is a transparent material, so both surfaces thereof can be used and the light can pass through it. This encourages the later electrical repairing process (e.g. laser welding) of the chips F11 and F21.

The flip-chip units F1 and F2 of the embodiment may have various attaching aspects. For example, the first flip-chip unit F1 and the second flip-chip unit F2 may be attached to each other by attaching the first chip F11 and the second glass circuit board F22 or by attaching the second chip F21 and the first glass circuit board F12. In the embodiment, the first chip F11 and the second glass circuit board F22 are attached to each other by an adhesive (not shown).

Figure 2B:
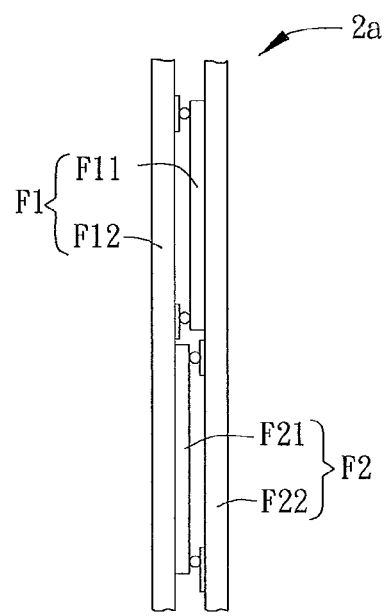

Furthermore, the difference between the semiconductor chip module 2a in FIG. 2B and the semiconductor chip module 2 in FIG. 2A is that, the flip-chip units F1 and F2 of the semiconductor chip module 2a are attached to each other by attaching the first chip F11 and the second glass circuit board F22 and by attaching the second chip F21 and the first glass circuit board F12. Specifically, the non-active surface of the first chip F11 and a surface of the second glass circuit board F22 are disposed opposite and attached to each other, and they are preferably attached in parallel. The non-active surface of the second chip F21 and a surface of the first glass circuit board F12 are disposed in opposite and attached to each other, and they are preferably attached in parallel.

Figure 2C:
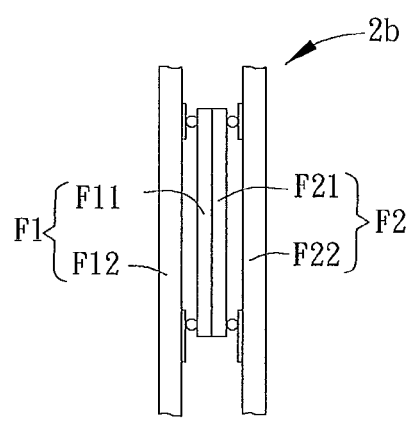
Figure 2D:
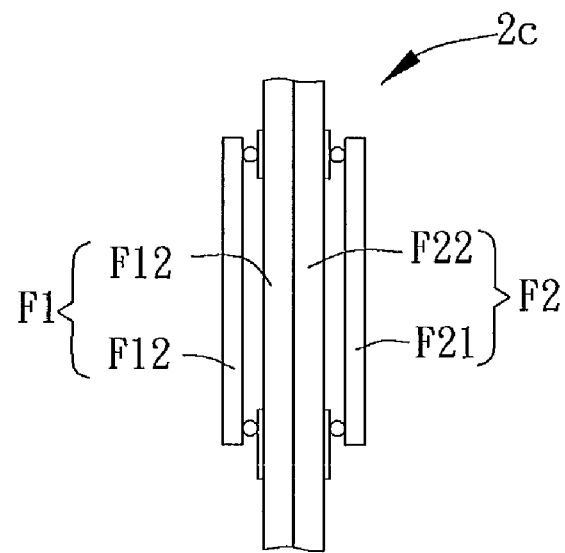

In addition, the difference between the semiconductor chip module 2b in FIG. 2C and the semiconductor chip module 2 is that, two flip-chip units F1 and F2 of the semiconductor chip module 2b are attached to each other by attaching the first chip F11 and the second chip F21. In the semiconductor chip module 2c shown in FIG. 2D, two flip-chip units F1 and F2 are attached to each other by attaching the first glass circuit board F12 and the second glass circuit board F22.

Figure 2E:
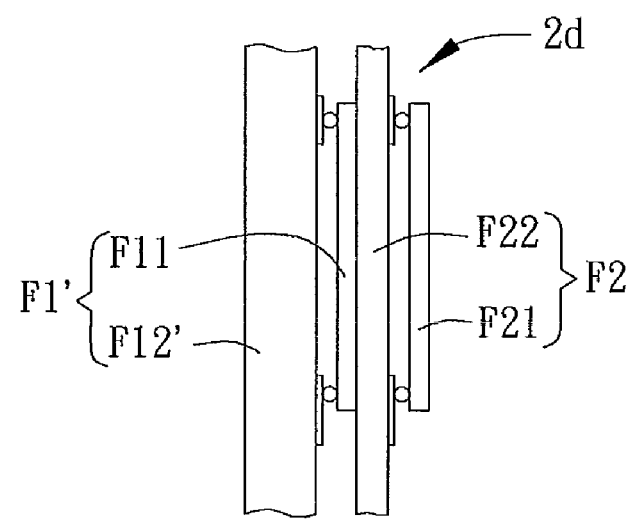
FIG. 2E is a schematic view of a semiconductor chip module having glass circuit boards with different thicknesses according to a preferred embodiment of the present invention.

Furthermore, the difference between the semiconductor chip module 2d in FIG. 2E and the semiconductor chip module 2 is that, the thickness of the second glass circuit board F22 is smaller than that of the first glass circuit board F12' because the second glass circuit board F22 went under a thinning process and the first glass circuit board F12' did not.

Figure 3:
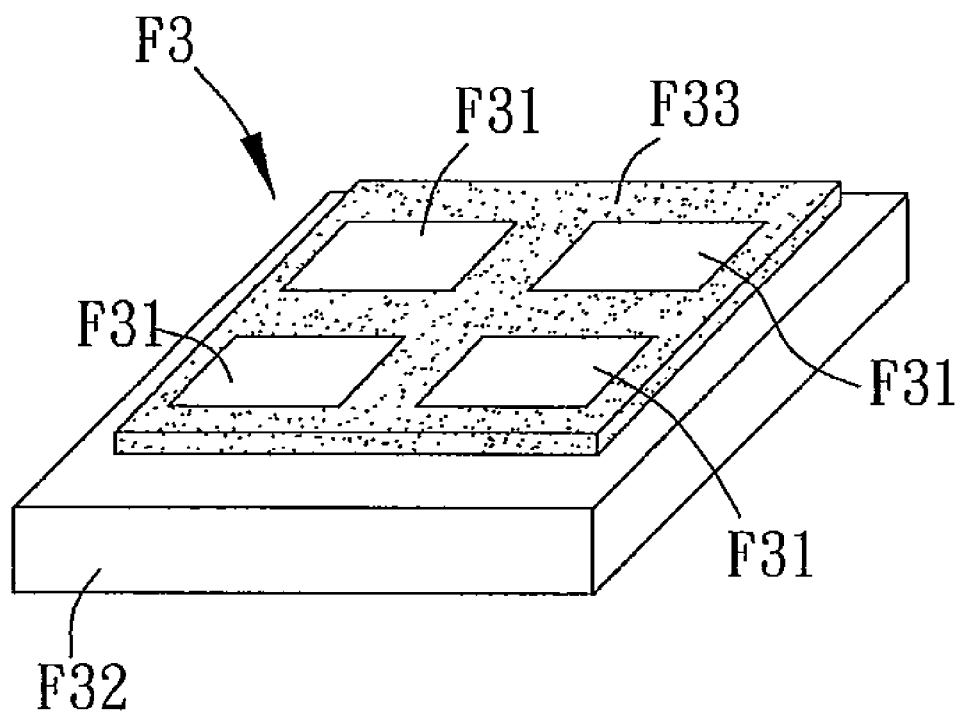
FIG. 3 is a schematic view of a semiconductor chip module having a planarization layer according to a preferred embodiment of the present invention.

FIG. 3 shows a flip-chip unit F3 according to another embodiment of the present invention. The flip-chip unit F3 may be a various aspect of the first flip-chip unit F1 or the second flip-chip unit F2. The flip-chip unit F3 includes a plurality of chips F31 and a glass circuit board F32, and the chips F31 are connected to the glass circuit board F32 by flip-chip bonding. Particularly the flip-chip unit F3 may further include a planarization layer F33, which is disposed on the glass circuit board F32 and on the periphery of the chip F31. The planarization layer F33 connects the chip F31 with the glass circuit board F32 and may or may not be aligned at the same level with the upper surface of the chip F31. The planarization layer F33 may facilitate an additional process on the chip F31, for example, providing strength for supporting and buffering the chips F31 and the glass circuit board F32 during the thinning process, such that when the glass circuit board F32 is thinned down by chemical mechanical polishing (CMP), it can prevent the chip F31 from being damaged or the glass circuit board F32 from breaking.

The planarization layer F33 may be formed by resin, which may include UV curing resin, thermal curing resin, cooling curing resin or other polymeric material. During the thinning process, the chips F31 may be thinned out with the planarization layer F33 by polishing or etching. After thinning, the total thickness of the chip F31 and the glass circuit board F32 may be less than 100 μm, preferably between 20 μm and 80 μm.

Figure 4A:
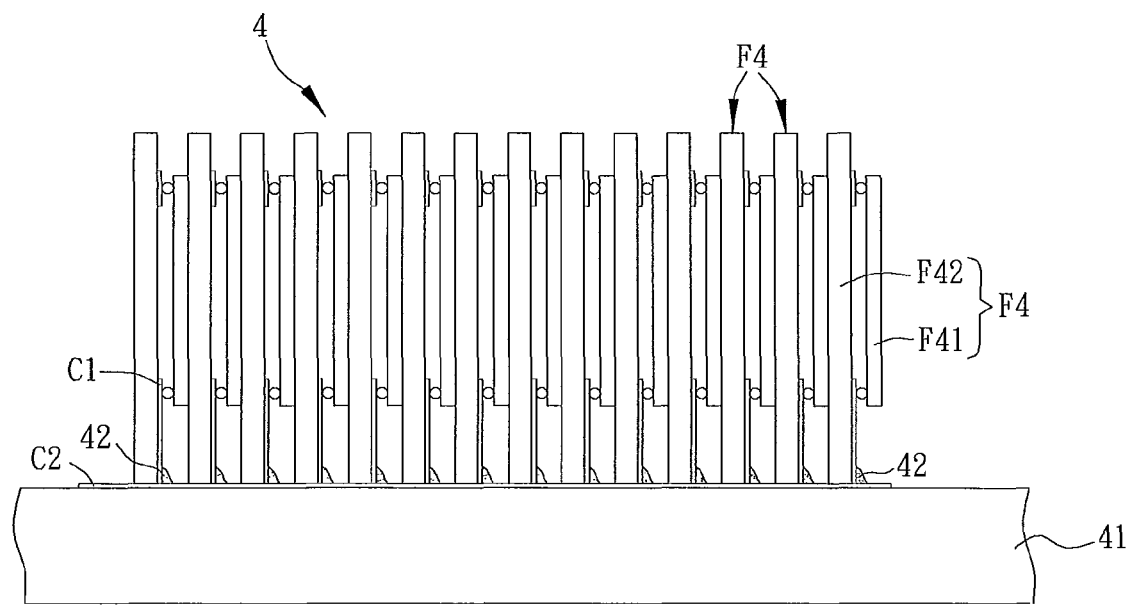
FIGS. 4A, 4B, and 5 are schematic views of different aspects of electrical connections between a flip-chip unit and a module circuit board in a semiconductor chip module according to a preferred embodiment of the present invention.

FIG. 4A is a schematic view of different aspects of electrical connections between a flip-chip unit F4 and a module circuit board 41 in a semiconductor chip module 4. With reference to FIG. 4A, the semiconductor chip module 4 includes a plurality of flip-chip units F4 and the module circuit board 41. The adjacent flip-chip units F4 are, for example, a first flip-chip unit and a second flip-chip unit. Each flip-chip unit F4 may have at least one chip F41 and a glass circuit board F42, and such chip(s) F41 is connected to the glass circuit board F42 by flip-chip bonding. In the embodiment, a chip F41 is connected to the glass circuit board F42 by flip-chip bonding. Each of the flip chip units F4 is attached to each other by, for example, an adhesive. In the embodiment, the flip chip F41 is attached to the glass circuit board F42 with each other. It is for sure that the flip-chip units F4 may be attached in the ways as shown in FIG. 2B to 2E. The material of the module circuit board 41 may include glass, quartz, metal, resin, polymeric material, or ceramics. The module circuit board 41 may be a glass circuit board, a printed circuit board, a ceramic circuit board, a conductive frame, or a flexible circuit board. In the embodiment, the module circuit board 41 is a printed circuit board.

The flip-chip unit F4 is electrically connected to the module circuit board 41. In the embodiment, the flip-chip unit F4 may be electrically connected to the module circuit board 41 via a conductive material 42 or a conductive element. The conductive material 42 may be a conductive paste, a conductive adhesive, a conductive bump, or a solder. In the embodiment, the flip-chip unit F4 is electrically connected to the module circuit board 41 via the conductive material 42, which is the solder (e.g. solder paste). Furthermore, the conductive element may be a wire or a flexible circuit board, which may include a COF package structure, a TAB package structure, or a FPC.

The flip-chip unit F4 is connected to the surface of the module circuit board 41 by its edge, such that the circuit layer C1 on the glass circuit board F42 is electrically connected to the circuit layer C2 on the module circuit board 41, and the chip F41 may be electrically connected to the module circuit board 41 via the circuit layers C1 and C2.

Additionally, the glass circuit board F42 of the flip-chip unit F4 in the embodiment is substantially perpendicular to the module circuit board 41. Compared to the conventional parallel-stacked chips, the size of the semiconductor module 4 in the embodiment can be further reduced and its integration can be increased. The glass circuit board F42 that is substantially perpendicular to the module circuit board 41 indicates an error is allowed as each glass circuit board F42 is disposed on the module circuit board 41 according to the actual manufacturing process. In addition, the edge of the glass circuit board F42 may be attached to the module circuit board 41 by adhesive at first for fixing the position and enhancing the strength of structure, and then the glass circuit board F42 is electrically connected to the module circuit board 41 via the conductive material 42.

Figure 4B:
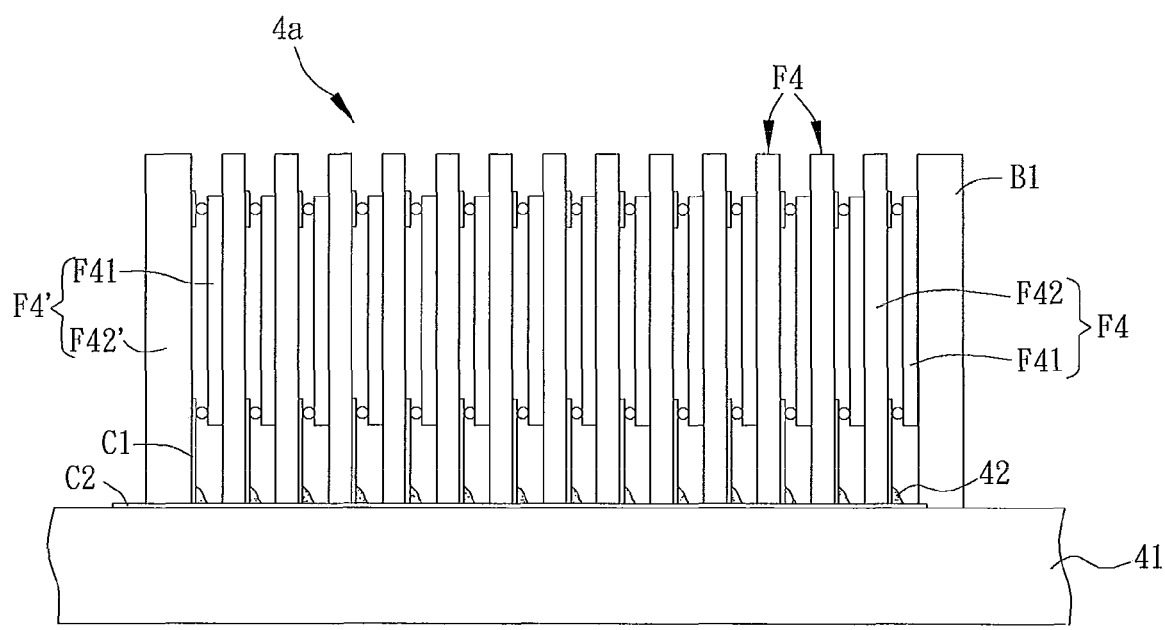

FIG. 4B shows a semiconductor chip module 4a of another aspect. With reference to FIG. 4B, the difference between the semiconductor chip module 4a and the semiconductor chip module 4 is that, the glass circuit board F42' of a flip-chip unit F4' of the semiconductor chip module 4a is thicker than the glass circuit board F42 of other flip-chip units F4. For example, the glass circuit board F42' did not go under the thinning process and the glass circuit board F42 did, or the glass circuit boards F42 and F42' both went under the thinning process but still have different thicknesses. Moreover, the semiconductor chip module 4a may further include an auxiliary substrate B1, which is attached to a chip F41 of a flip-chip unit F4. The auxiliary substrate B1 may be, for example, a substrate of a layer without circuits or a glass circuit board. Its thickness may be larger than that of the glass circuit board F42.

Figure 5:
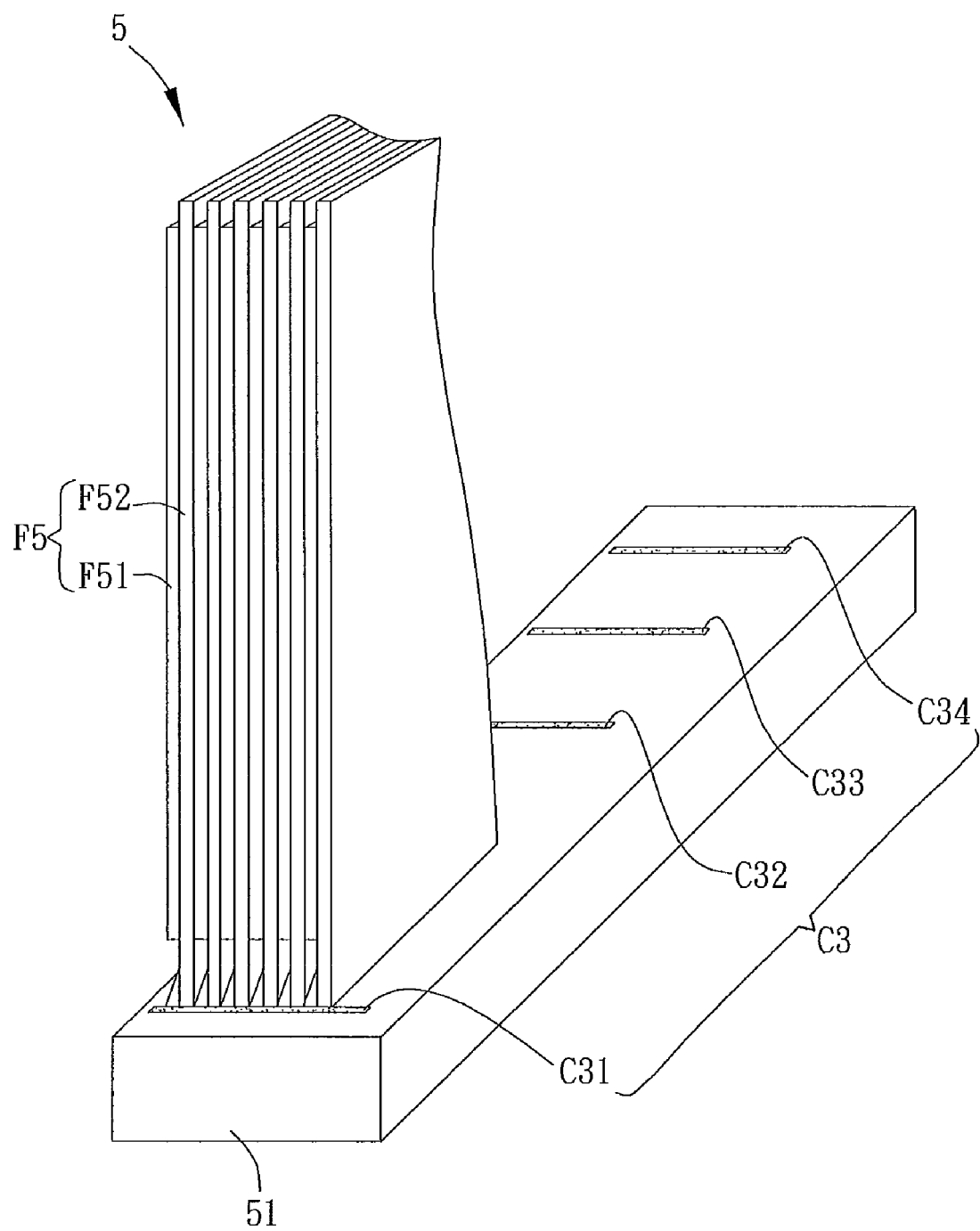

FIG. 5 shows a semiconductor chip module 5 in an aspect as a memory chip module. With reference to FIG. 5, the semiconductor chip module 5 includes a plurality of flip-chip units F5 and a module circuit board 51, and the flip-chip unit F5 is electrically connected to the module circuit board 51. The technical features of the flip-chip unit F5 are the same as those of the previously-mentioned flip-chip unit F4, therefore a detailed description thereof will be omitted. In addition, the conductive bump is not depicted between the chip F51 and the glass circuit board F52 in FIG. 5 due to the scale of the figure. The module circuit board 51 has a circuit layer C3, which may include a data bus C31, a power bus C32, an address bus C33, or a control bus C34. The circuit layer C3 may also include other buses or other layout of signal lines and loops, e.g. an electrostatic discharge (ESD) protection loop. Each flip-chip unit F5 is electrically connected to the data bus C31, power bus C32, address bus C33, and control bus C34.

Figure 6:
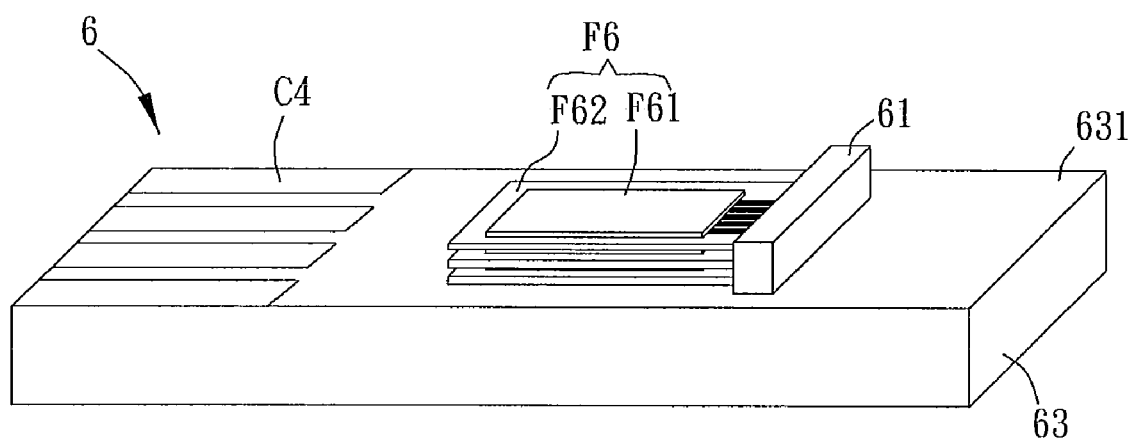
FIG. 6 is a schematic view of an electrical connection between a module circuit board and a circuit board in a semiconductor chip module according to a preferred embodiment of the present invention.

FIG. 6 shows a semiconductor chip module 6 of another aspect. With reference to FIG. 6, the semiconductor chip module 6 includes a plurality of flip-chip units F6, a module circuit board 61 and a circuit board 63. The technical features of the flip-chip unit F6 and module circuit board 61 are the same as those of the flip-chip unit F5 and module circuit board 51 in the previous embodiment, therefore a detailed description thereof will be omitted. Specifically, the module circuit board 61 in the embodiment is connected to a surface 631 of the circuit board 63 and electrically connected to a circuit layer C4 of the circuit board 63. In the embodiment, the flip-chip unit F6 is modularized by the module circuit board 61 and applies to the circuit board 63. The semiconductor chip module 6 may be, for example, a flash memory device with a very large capacity. In the embodiment, the glass circuit board F62 of the flip-chip F6 and the circuit board 63 are substantially disposed parallel to each other so as to reduce the size of the semiconductor chip module 6 and increase its integration. Additionally, the semiconductor chip module 6 may include a plurality of module circuit boards 61 disposed on the circuit board 63 and each module circuit board 61 is electrically connected to a plurality of flip-chip units F6.

Figure 7:
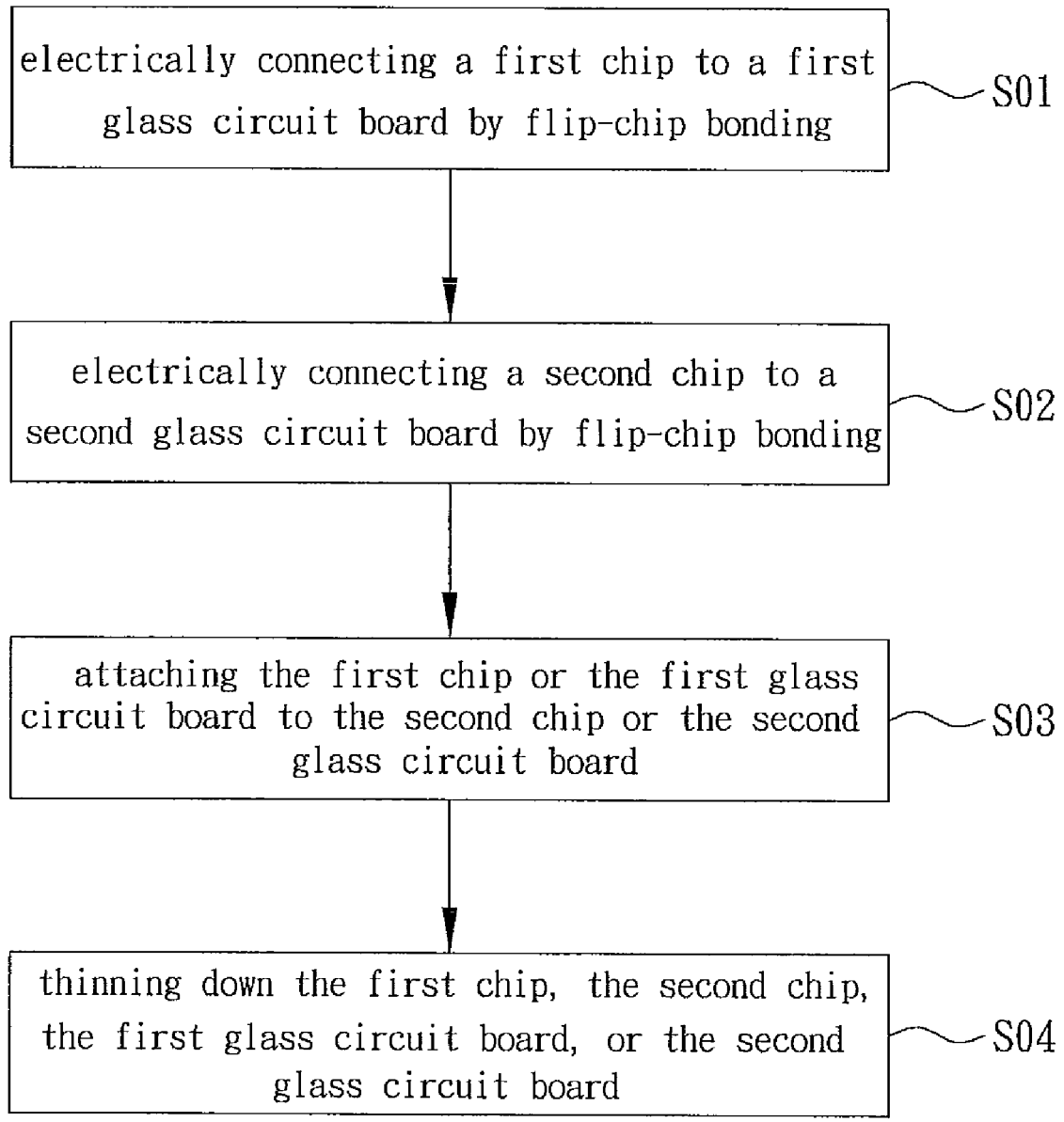
FIG. 7 is a flowchart of a method for manufacturing a semiconductor chip module according to a preferred embodiment of the present invention.

FIG. 7 is a flowchart of a method for manufacturing a semiconductor chip module. With reference to FIG. 7, it includes steps S01 to S04. The manufacturing method disclosed in the embodiment is for manufacturing the semiconductor chip modules 2 to 2d as shown in FIG. 2A to 2E. Referring to which, the manufacturing method is illustrated as follows.

In step S01, at least one first chip F11 is electrically connected to a first glass circuit board F12 by flip-chip bonding.

In step S02, at least one second chip F21 is electrically connected to a second glass circuit board F22 by flip-chip bonding.

In step S03, the first chip F11 or the first glass circuit board F12 is attached to the second chip F21 or the second glass circuit board F22.

In step S04, the first chip, the second chip, the first glass circuit board, or the second glass circuit board is thinned down.

The steps of the manufacturing method in the embodiment are illustrated while describing the semiconductor chip modules 2 to 2d in the previous embodiment; therefore a detailed description will be omitted. Step S04 will be detailed described later.

Figure 8A:
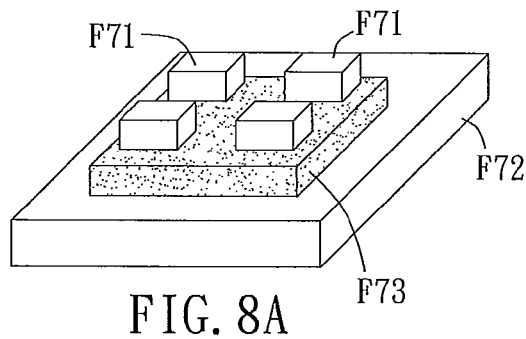
FIGS. 8A to 8G are schematic views of a method for manufacturing a semiconductor chip module according to a preferred embodiment of the present invention.

FIGS. 8A to 8G show the procedure of another manufacturing method of a semiconductor chip module. With reference to FIG. 8A, first of all, at least one first chip F71 is electrically connected to a first glass circuit board F72 by flip-chip bonding. In the embodiment, a plurality of first chips F71 are connected to the glass circuit board F72 by flip-chip bonding for example. After that, a planarization layer F73 is formed on the periphery of the first chip F71. The planarization layer F73 is disposed on the first glass circuit board F72 and on the periphery of the first chip F71, and connects the first chip F71 with the first glass circuit board F72. The planarization layer F73 facilitates the thinning process of the first chip F71 or the first glass circuit board F72. It is noted that the disposition of the planarization layer F73 may be implemented or left out according to the demands.

Figure 8B:
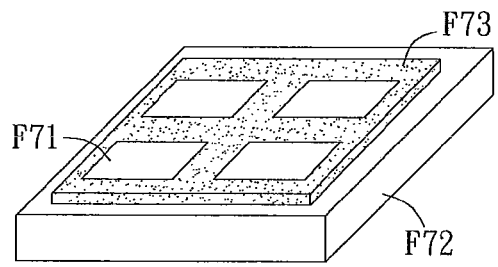

As shown in FIG. 8B, the manufacturing method may further include a step of thinning down the first chip F71. By thinning the non-active surface of the first chip F71, the thickness of the first chip F71 may be less than 50 µm, preferably between 10 µm and 40 µm. The thinning process may be implemented by polishing (e.g. CMP or mechanical polishing) or etching. A plurality of first chips F71 are disposed on the glass circuit board F72, such that they can be thinned down at the same time during the thinning process. Furthermore, the planarization layer F73 may provide the chip F71 and the glass circuit board F72 the strength for supporting and buffering, so as to prevent the chip F71 from being damaged by the thinning process or the glass circuit board F72 from breaking. After the thinning process, preferably the planarization layer F73 is aligned with the upper surface of the first chip F71 at the same level. It is noted that the thinning process may be implemented without the planarization layer F73. In addition, the thinning process may be implemented or left out according to the demands.

Figure 8C:
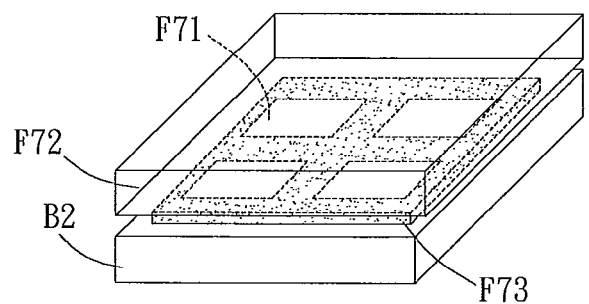

Please refer to FIG. 8C, the manufacturing method further include a step of attaching an auxiliary substrate B2 to the first chips F71. The first chip F71 and the first glass circuit board F72 shown in FIG. 8C are the reversed first chip F71 and first glass circuit board F72 shown in FIG. 8B. In the embodiment, the auxiliary substrate B2 may be a carrier of the first chip F71 and the first glass circuit board F72. The type and material of the auxiliary substrate B2 are not limited herein. For example, the auxiliary substrate B2 may be detachable, transparent, insulated, or conductive. It is noted that this step may be implemented or left out according to the demands.

Figure 8D:
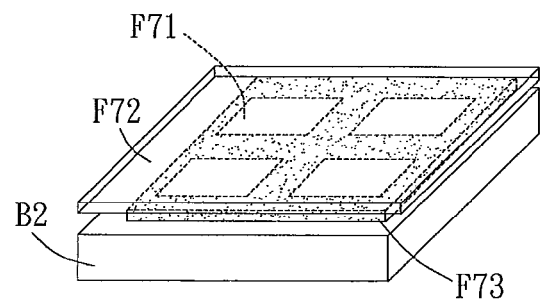

As shown in FIG. 8D, the manufacturing method may further include a step of thinning down the first glass circuit board F72. With the support from the auxiliary substrate B2, the thinning of the first glass circuit board F72 may be facilitated, and the breaking of the first glass circuit board F72 and the damage to the first chip F71 may be prevented. It is for sure that the first glass circuit board F72 may be thinned down without an auxiliary substrate B2. In the embodiment, after the thinning process, the total thickness of the first chip F71 and the first glass circuit board F72 may be less than 100 µm, preferably between 20 µm and 80 µm. Moreover, the step of thinning down the first glass circuit board F72 may be implemented or left out according to the demands.

Figure 8E:
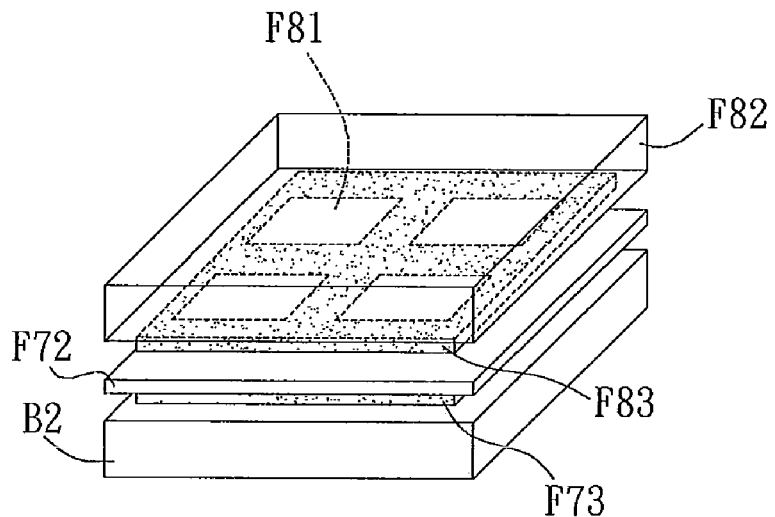

As shown in FIG. 8E, the manufacturing method may further include a step of electrically connecting at least one second chip F81 and a second glass circuit board F82 by flip-chip bonding, and a step of thinning down the second chip F81. It is noted that the step of thinning down the second chip F81 may be implemented or left out according to the demands. Additionally, the manufacturing method may further include a step of forming a planarization layer F83 on the second glass circuit board F82. The planarization layer F83 may be formed before the second chip F81 is thinned down. Furthermore, the manufacturing method may further include a step of attaching the second chip F81 to the first glass circuit board F72.

Figure 8F:
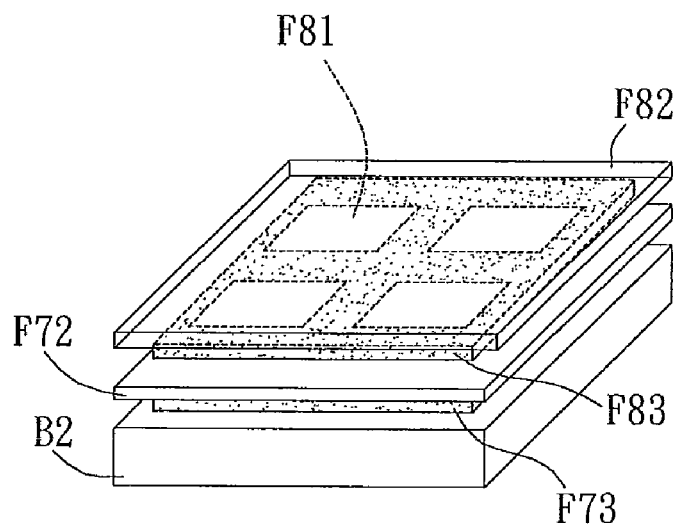

Please refer to FIG. 8F, the manufacturing method may further include a step of thinning down the second glass circuit board F82. The first chip F71, first glass circuit board F72, and auxiliary substrate B2 may be used as the carrier for the second chip F81 and the second glass circuit board F82. It may be helpful to thin down the second glass circuit board F82, and with the supporting strength from the first glass circuit board F72 and the auxiliary substrate B2, prevent the second glass circuit board F82 from breaking and the second chip F81 from being damaged. It is for sure that the second glass circuit board F82 may be thinned down before the second chip F81 connects to the first glass circuit board F71. By thinning down, the total thickness of the second chip F81 and the second glass circuit board F82 may be less than 100 µm, preferably between 20 µm and 80 µm. In addition, in the manufacturing method of the embodiment, a step of removing the auxiliary substrate B2 may be included according to the actual demands. For example, the auxiliary substrate B2 may be removed after the chips are attached to the glass circuit board and once a thinning process is no longer in need.

Figure 8G:
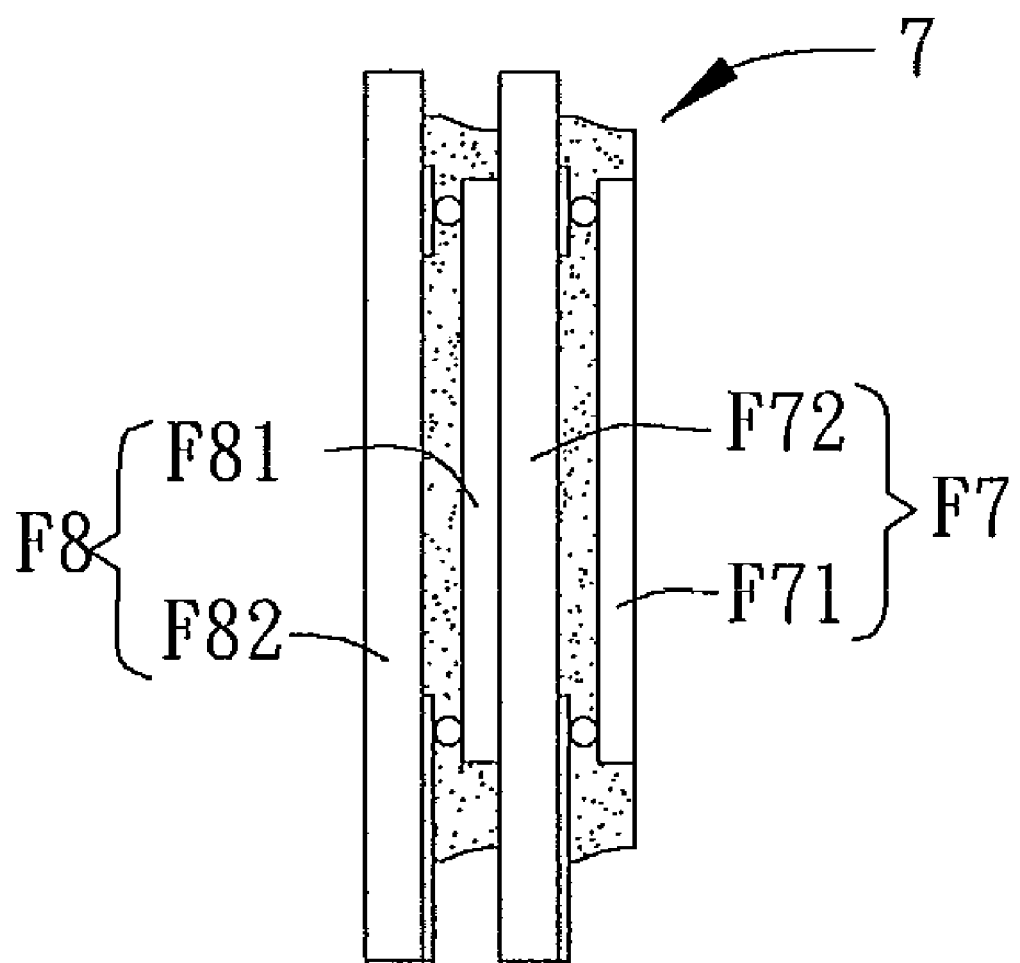

In addition, in the embodiment, the manufacturing method may also include a step of dividing the first glass circuit board F72 and the second glass circuit board F82 to form a plurality of semiconductor chip modules 7 as shown in FIG. 8G For example, the first chip F71 and the second chip F81 are aligned with each other to be easily divided into four semiconductor chip modules 7 for the later use. Each of the divided semiconductor chip modules 7 may include at least one first chip F71, a part of the first glass circuit board F72, at least one second chip F81, and a part of the second glass circuit board F82. The first chip F71 and the first glass circuit board F72 may be called the first flip-chip unit F7, and the second chip F81 and the second glass circuit board F82 may be called the second flip-chip unit F8.

In addition, the manufacturing method in the embodiment may also include a step of electrically connecting the first glass circuit board F72 and the second glass circuit board F82 to a module circuit board. Moreover, the manufacturing method in the embodiment may include a step of perpendicularly disposing the first glass circuit board F72 and the second glass circuit board F82 on the module circuit board by surface bonding. Such manufacturing method is illustrated in the previous embodiment, thus a detailed description thereof is omitted herein.

To sum up, the semiconductor chip module and its manufacturing method of the present invention disclose that a plurality of flip-chip units are attached to each other and the chip of the flip-chip unit is electrically connected to the glass circuit board by flip-chip bonding. Because the chips of the present invention are not electrically connected and stacked to each other by wire bonding, a spacer is not needed between the chips so to reduce the size of the stacked chips. Each flip-chip unit may be separately manufactured and then stacked to each other so as to increase the adaptability of the manufacturing process. Besides, the structural strength of the flip-chip unit of the present invention is larger than that bonded by wire, therefore the product yield and product reliability can be increased. In addition, since the glass circuit boards and chips of the flip-chip unit are not wire bonded, they may be processed, for example, by a thinning process to thin down the thicknesses thereof. The total thickness of the flip-chip unit may be reduced to less than 100 µm, so as to largely decrease the size of the stacked chips and enhance the integration of the chips. Furthermore, since the flip-chip unit of the present invention is substantially perpendicularly disposed on the module circuit board, the size of the stacked chips of the present invention may further be reduced and the integration may be enhanced compared to the flip-chip unit disposed parallel to the module circuit board in prior art.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A semiconductor chip module, comprising:
   a first flip-chip unit having a first chip and a first glass circuit board, wherein a first surface of the first chip is connected to the first glass circuit board by flip-chip bonding; and
   a second flip-chip unit having a second chip and a second glass circuit board, wherein the second chip is connected to the second glass circuit board by flip-chip bonding, a second surface of the first chip of the first flip-chip unit and the second glass circuit board of the second flip-chip unit are attached to each other, and the first surface of the first chip is opposite to the second surface of the first chip.

2. The semiconductor chip module according to claim 1, further comprising:
   a module circuit board electrically connecting to the first flip-chip unit and the second flip-chip unit.

3. The semiconductor chip module according to claim 2, wherein the material of the module circuit board comprises glass, quartz, metal, resin, polymeric material, or ceramics.

4. The semiconductor chip module according to claim 2, wherein the module circuit board comprises a circuit layer having a data bus, a power bus, an address bus, or a control bus.

5. The semiconductor chip module according to claim 2, wherein the first flip-chip unit or the second flip-chip unit is electrically connected to the module circuit board via a conductive element or a conductive material.

6. The semiconductor chip module according to claim 5, wherein the conductive element comprises a wire or a flexible circuit board, and the conductive material comprises a conductive paste, a conductive adhesive, a conductive bump, or a solder.

7. The semiconductor chip module according to claim 2, wherein the first glass circuit board and the second glass circuit board are substantially perpendicular to the module circuit board.

* * * * *